(12) United States Patent  
Granneman

(10) Patent No.: US 7,754,013 B2  
(45) Date of Patent: Jul. 13, 2010

(54) APPARATUS AND METHOD FOR ATOMIC LAYER DEPOSITION ON SUBSTRATES

(75) Inventor: Ernst H. A. Granneman, Hilversum (NL)

(73) Assignee: ASM International N.V. (NL)

(*) Notice: Subject to any disclaimer, the term of this patent is extended or adjusted under 35 U.S.C. 154(b) by 940 days.

(21) Appl. No.: 11/527,080

(22) Filed: Sep. 25, 2006

(65) Prior Publication Data
US 2007/0015374 A1    Jan. 18, 2007

Related U.S. Application Data

(63) Continuation of application No. 10/728,126, filed on Dec. 3, 2003, now abandoned.

(60) Provisional application No. 60/431,337, filed on Dec. 5, 2002.

(51) Int. Cl.
*C30B 23/04*    (2006.01)

(52) U.S. Cl. .................. 117/105; 117/85; 117/89; 117/104

(58) Field of Classification Search ............ 117/85, 117/89, 104, 105
See application file for complete search history.

(56) References Cited

U.S. PATENT DOCUMENTS

| | | |
|---|---|---|
| 3,854,443 A | 12/1974 | Baerg |
| 4,358,686 A | 11/1982 | Kinoshita |
| 4,522,149 A | 6/1985 | Garbis et al. |
| 4,523,985 A | 6/1985 | Dimock |
| 4,579,618 A | 4/1986 | Celestino |
| 4,582,720 A | 4/1986 | Yamazaki |
| 4,590,042 A | 5/1986 | Drage |

(Continued)

FOREIGN PATENT DOCUMENTS

EP    0 015 390 B1    9/1985

(Continued)

OTHER PUBLICATIONS

U.S. Appl. No. 10/782,727, filed Feb. 18, 2004, Lindfors et al.

(Continued)

*Primary Examiner*—Robert M Kunemund  
(74) *Attorney, Agent, or Firm*—Knobbe, Martens, Olson & Bear LLP

(57) ABSTRACT

A deposition station allows atomic layer deposition (ALD) of films onto a substrate. The station comprises an upper and a lower substantially flat part between which a substrate is accommodated. The parts are positioned opposite each other and parallel to the substrate during processing. At least one of the parts is provided with a plurality of gas channels that allow at least two mutually reactive reactants to be discharged out of that part to the substrate. The discharge is configured to occur in a sequence of alternating, separated pulses for ALD. In addition, each part is preferably configured to be about 1 mm or less from the substrate to minimize the volume of the reaction chamber to increase the efficiency with which gases are purged from the chamber. Also, for each reactant, the upper and lower parts are preferably kept at a temperature outside of the window in which optimal ALD of that reactant occurs, thereby minimizing deposition of that reactant on deposition station surfaces.

32 Claims, 10 Drawing Sheets

U.S. PATENT DOCUMENTS

| | | | |
|---|---|---|---|
| 4,595,484 A | 6/1986 | Giammarco et al. | |
| 4,597,618 A | 7/1986 | Reimer | |
| 4,694,779 A | 9/1987 | Hammond et al. | |
| 4,738,748 A | 4/1988 | Kisa | |
| 4,798,165 A | 1/1989 | deBoer et al. | |
| 4,851,095 A | 7/1989 | Scobey et al. | |
| 4,859,625 A * | 8/1989 | Matsumoto ................ | 117/93 |
| 5,010,842 A | 4/1991 | Oda et al. | |
| 5,102,523 A | 4/1992 | Beisswenger et al. | |
| 5,356,673 A | 10/1994 | Schmitt et al. | |
| 5,370,709 A | 12/1994 | Kobayashi | |
| 5,422,139 A | 6/1995 | Fischer | |
| 5,453,124 A | 9/1995 | Moslehi et al. | |
| 5,500,256 A | 3/1996 | Watabe | |
| 5,542,559 A | 8/1996 | Kawakami et al. | |
| 5,551,982 A | 9/1996 | Anderson et al. | |
| 5,595,606 A | 1/1997 | Fujikawa et al. | |
| 5,622,606 A | 4/1997 | Kugler et al. | |
| 5,624,498 A | 4/1997 | Lee et al. | |
| 5,656,123 A | 8/1997 | Salimian et al. | |
| 5,669,975 A | 9/1997 | Ashtiani | |
| 5,674,320 A | 10/1997 | Kordina et al. | |
| 5,683,537 A | 11/1997 | Ishii | |
| 5,685,914 A | 11/1997 | Hills et al. | |
| 5,711,811 A | 1/1998 | Suntola et al. | |
| 5,716,453 A | 2/1998 | Chen | |
| 5,766,364 A | 6/1998 | Ishida et al. | |
| 5,781,693 A | 7/1998 | Balance et al. | |
| 5,792,261 A | 8/1998 | Hama et al. | |
| 5,811,022 A | 9/1998 | Savas et al. | |
| 5,884,009 A | 3/1999 | Okase | |
| 5,888,907 A | 3/1999 | Tomoyasu et al. | |
| 5,916,365 A | 6/1999 | Sherman | |
| 5,938,333 A | 8/1999 | Kearney | |
| 5,983,906 A | 11/1999 | Zhao et al. | |
| 6,025,013 A | 2/2000 | Heming et al. | |
| 6,042,652 A | 3/2000 | Hyun et al. | |
| 6,097,005 A | 8/2000 | Akimoto | |
| 6,111,225 A | 8/2000 | Ohkase et al. | |
| 6,148,761 A | 11/2000 | Majewski et al. | |
| 6,183,565 B1 * | 2/2001 | Granneman et al. ......... | 118/725 |
| 6,184,158 B1 | 2/2001 | Shufflebotham et al. | |
| 6,200,389 B1 | 3/2001 | Miller et al. | |
| 6,200,893 B1 | 3/2001 | Sneh | |
| 6,270,571 B1 | 8/2001 | Iwasaki et al. | |
| 6,291,800 B1 | 9/2001 | Shirakawa et al. | |
| 6,305,314 B1 | 10/2001 | Sneh et al. | |
| 6,333,019 B1 | 12/2001 | Coppens | |
| 6,342,277 B1 | 1/2002 | Sherman | |
| 6,364,949 B1 | 4/2002 | Or et al. | |
| 6,368,987 B1 | 4/2002 | Kopacz et al. | |
| 6,399,922 B2 | 6/2002 | Okase et al. | |
| 6,416,822 B1 | 7/2002 | Chiang et al. | |
| 6,428,859 B1 | 8/2002 | Chiang et al. | |
| 6,435,428 B2 | 8/2002 | Kim et al. | |
| 6,446,573 B2 | 9/2002 | Hirayama et al. | |
| 6,478,872 B1 | 11/2002 | Chae et al. | |
| 6,502,530 B1 | 1/2003 | Turlot et al. | |
| 6,537,418 B1 | 3/2003 | Muller et al. | |
| 6,736,408 B2 | 5/2004 | Olgado et al. | |
| 6,890,386 B2 | 5/2005 | DeDontney et al. | |
| 6,921,437 B1 | 7/2005 | DeDontney et al. | |
| 2002/0066411 A1 | 6/2002 | Chiang et al. | |
| 2002/0068458 A1 | 6/2002 | Chiang et al. | |
| 2002/0092471 A1 | 7/2002 | Kang et al. | |
| 2002/0197402 A1 | 12/2002 | Chiang et al. | |
| 2003/0143328 A1 | 7/2003 | Chen et al. | |
| 2004/0050325 A1 | 3/2004 | Samoilov et al. | |
| 2004/0050326 A1 | 3/2004 | Thilderkvist et al. | |
| 2004/0216665 A1 | 11/2004 | Soininen et al. | |
| 2004/0221809 A1 | 11/2004 | Ohmi et al. | |
| 2005/0208217 A1 | 9/2005 | Shinriki et al. | |

FOREIGN PATENT DOCUMENTS

| | | |
|---|---|---|
| EP | 0 550 058 A2 | 7/1993 |
| JP | 59004040 | 1/1984 |
| JP | 61-101020 | 5/1986 |
| JP | 61-263118 | 11/1986 |
| JP | 61-294812 | 12/1986 |
| JP | 62-021237 | 1/1987 |
| JP | 62-080271 | 4/1987 |
| JP | 63-136532 | 6/1988 |
| JP | 2-030119 | 1/1990 |
| JP | 20-34915 | 2/1990 |
| JP | 4-075328 | 3/1992 |
| JP | 40-78130 | 3/1992 |
| JP | 9-129555 | 5/1997 |
| JP | 10256354 | 9/1998 |
| JP | 11-121381 | 4/1999 |
| JP | 2002-121677 | 4/2002 |
| JP | 2003-060186 | 2/2003 |
| JP | 2004-292872 | 10/2004 |
| WO | WO 96/17106 | 6/1996 |
| WO | WO 96/17969 | 6/1996 |
| WO | WO 00/12964 | 3/2000 |
| WO | WO 00/63957 | 10/2000 |
| WO | WO 00/79019 A1 | 12/2000 |
| WO | WO00/79576 A1 | 12/2000 |
| WO | WO 01/00680 A1 | 1/2001 |
| WO | WO01/17692 A1 | 3/2001 |
| WO | WO 02/08488 A1 | 1/2002 |
| WO | WO 02/26192 A2 | 4/2002 |
| WO | WO 03/023835 A1 | 3/2003 |

OTHER PUBLICATIONS

De Keijser et al., "Atomic layer epitaxy of gallium arsenide with the use of atomic hydrogen," *Appl. Phys. Lett.*, vol. 58, No. 11, Mar. 18, 1991, pp. 1187-1189.

Imai et al., "Atomic layer epitaxy of Si using atomic H," *Thin Solid Films*, vol. 225, (1993), pp. 168-172.

Koleske et al., "Atomic layer epitaxy of Si of Ge(100) using $Si_2Cl_6$ and atomic hydrogen," *Appl. Phys. Lett.*, vol. 64, No. 7, Feb. 14, 1994, pp. 884-886.

Mahajan et al., "Si atomic layer epitaxy based on $Si_2H_6$ and remote He plasma bombardment," *Thin Solid Films*, vol. 225, (1993), pp. 177-182.

Singh et al., "Measurement of neutral and ion composition, neutral temperature, and electron energy distribution function in a $CF_4$ inductively coupled plasma," *J. Vac. Sci. Technol. A.*, vol. 19, No. 3, May/Jun. 2001, pp. 718-729.

Singh et al., "Measurements of the electron energy distribution function in molecular gases in a shielded inductively coupled plasma," *Journal of Applied Physics*, vol. 88, No. 7, Oct. 1, 2000, pp. 3889-3898.

Sugahara et al., "Atomic hydrogen-assisted ALE of germanium," *Applied Surface Science*, vol. 90, (1995), pp. 349-356.

Sugahara et al. "Atomic layer epitaxy of germanium," *Applied Surface Science*, vol. 82/83, (1994), pp. 380-386.

Sugahara et al., "Modeling of germanium atomic-layer-epitaxy," *Applied Surface Science*, vol. 112, (1997), pp. 176-186.

* cited by examiner

APPARATUS AND METHOD FOR ATOMIC LAYER DEPOSITION ON SUBSTRATES

REFERENCE TO RELATED APPLICATION

This application is a continuation of U.S. patent application Ser. No. 10/728,126, filed Dec. 3, 2003 now abandoned, which claims the priority benefit under 35 U.S.C. §119(e) of provisional application No. 60/431,337, filed Dec. 5, 2002.

FIELD OF THE INVENTION

The invention relates generally to the field of semiconductor processing and, more particularly, to an apparatus and method for the atomic layer deposition (ALD) of films onto semiconductor substrates.

BACKGROUND OF THE INVENTION

Various types of reactors are used for atomic layer deposition (ALD) of thin films on semiconductor substrates. During ALD, a semiconductor substrate is exposed to alternating and sequential pulses of at least two mutually reactive reactants. The substrate temperature is chosen to be in a window above the reactants' condensation temperatures and below the reactant's thermal decomposition temperatures, so that during a reactant pulse a monolayer of the reactant adsorbs onto the substrate in a self-saturating manner without condensing or decomposing. After exposing the substrate to a first reactant, the process chamber is purged to remove any excess first reactant from the substrate and to remove any residual first reactant from the gas phase. The substrate is then exposed to a second reactant pulse, the second reactant being reactive with the first reactant.

Adequate purging and/or evacuating between the alternating reactant pulses is vital for good control of the deposition process. As purging takes time, the ALD process is generally a slow process.

Because of continual pressures within the semiconductor processing industry for increased throughput, there is a need for methods and apparatuses for ALD that allow efficient purging between subsequent reactant pulses, so that the purge time between pulses can be reduced and the overall deposition rate of the ALD process can be increased. In addition, because contaminating reactants can remain in a chamber by being deposited onto reactor walls there is also a need for reactors for ALD wherein deposition on the reactor walls is reduced or prevented.

SUMMARY OF THE INVENTION

In accordance with one preferred embodiment of the invention, a film deposition station is provided for depositing a film onto a substrate. The deposition station comprises a first part and a second part for accommodating a semiconductor substrate between them. The first part and the second part are positioned opposite each other and parallel to a substrate, upon retention of the substrate between the first and second parts. The first part and the second part are also configured to be spaced less than about 2 mm from a main surface of a substrate accommodated between them. At least one of the parts is provided with a heater for heating that part and each part is provided with a set of gas supply channels connected to a source of gas. The source of gas for the first part is configured to supply mutually reactive reactants in a sequence of alternating, separated pulses for atomic layer deposition (ALD).

In accordance with another preferred embodiment, a reactor is provided for semiconductor processing. The reactor comprises an upper reactor block and a lower reactor block for accommodating a semiconductor substrate therebetween. The upper and the lower reactor blocks are configured to be less than about 2 mm from a major surface of the substrate when the substrate is retained therebetween. Also, the reactor is configured to discharge mutually reactive reactants from at least one of the reactor blocks to the substrate in sequential alternating, separated pulses. The at least one of the reactor blocks comprises a set of gas channels configured to transport and discharge the sequential alternating, separated pulses of reactant to the substrate.

In accordance with yet another preferred embodiment, a method is provided for depositing a layer on a semiconductor substrate. The method comprises providing an apparatus having a first side section and a second side section located opposite one another. The side sections each have facing planar surfaces and at least one of the side sections is heated to a temperature higher than about 200° C. The substrate is placed in the apparatus between the first and second side sections and two gas streams, in opposing directions, are applied from the first and second side sections to two opposing planar sides of the semiconductor substrate. The spacing between each of the first and second side sections and the semiconductor substrate is at most about 1 mm and the facing planar surfaces of the side sections extend completely across the opposing planar sides of the semiconductor substrate. At least one of the gas streams provides different reactants in a sequence of alternating, separated pulses for an atomic layer deposition (ALD) process.

In accordance with another preferred embodiment, a method is provided for semiconductor processing. The method comprises providing a processing apparatus having a first and a second reactor block. A substrate is positioned between the first and the second reactor blocks, wherein the substrate is less than about 2 mm from each of the first and the second reactor blocks after positioning. Mutually reactive reactants are discharged from the first reactor block in alternating, temporally separated pulses onto the substrate. The substrate is heated using the first or second reactor block to one or more desired substrate temperatures, wherein the first reactor block is at a first temperature at which condensation or decomposition of the mutually reactive reactants is substantially prevented.

In accordance with yet another preferred embodiment, a method is provided for semiconductor processing. The method comprises loading a substrate in a reaction chamber and completely supporting the substrate on a gas cushion in the chamber. While completely supporting the substrate on the gas cushion, mutually reactive reactants are discharged in alternating, temporally separated pulses onto a major surface of the substrate.

In accordance with another preferred embodiment of the invention, a film deposition station is provided for depositing a film onto a substrate. The deposition station comprises a first part and a second part for accommodating a semiconductor substrate between them. The first part and the second part are positioned opposite each other and parallel to the substrate upon retention of the substrate between the first and second parts. The first part is provided with a first set of gas supply channels connected to a source for a first reactant and a second set of gas supply channels connected to a source for a second reactant. The first and second set of gas supply channels are configured to keep the reactants separated until discharging the reactants out from the gas supply channels to the substrate, wherein the first and the second reactant are mutually reactive. The deposition station also comprises controls to supply the first and the second reactant from the source for a first reactant and from the source for a second reactant in sequential alternating separated pulses for atomic layer deposition (ALD).

BRIEF DESCRIPTION OF THE DRAWINGS

The invention will be better understood from the detailed description of the preferred embodiments and from the appended drawings, which are meant to illustrate and not to limit the invention, and wherein.

DETAILED DESCRIPTION OF THE INVENTION

Figure 1:
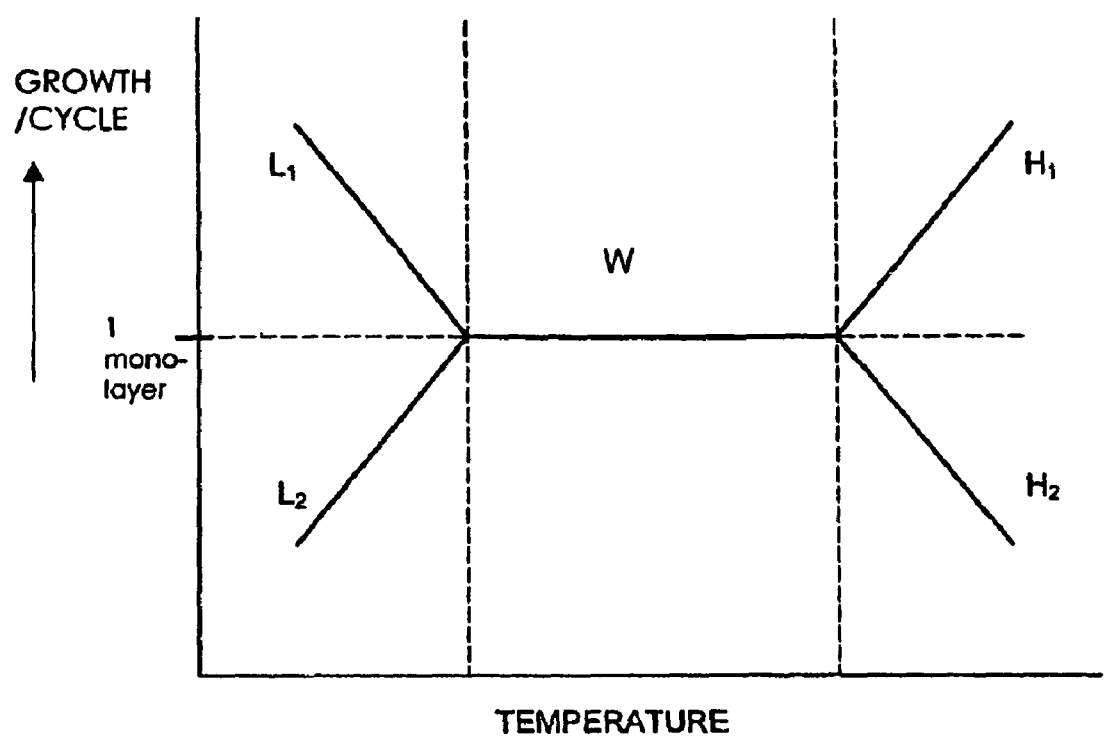
FIG. 1 shows a graph of the theoretical reaction regimes of different process recipes for a particular set of ALD reactants in different temperature ranges.

According to preferred embodiments of the invention, a deposition station is provided for depositing films by exposing a substrate to mutually reactive reactants, preferably in alternating pulses, such as for an atomic layer deposition process. The station preferably comprises two parts which delimit a reaction chamber in which the substrate is accommodated. To prevent unintended reaction of the reactants, at least one of the parts is provided with a plurality of gas channels which allow multiple reactants to be flowed through that part without contacting one another until being discharged into the reaction chamber. Preferably, as discussed below, the two parts are positioned close to the substrate during processing to minimize the volume of the reaction chamber and to allow quicker purging and cycling of reactants into the chamber. In addition, as discussed below, at least one of the two parts delimiting the reaction chamber can be heated. Preferably, the temperatures of these two parts are different from the desired process temperature of the substrate and are out of the window of temperatures in which deposition rate is optimized, thus minimizing deposition of reactants on the deposition station surfaces. Advantageously, by minimizing the purge time and the contamination of deposition station surfaces, reactor throughput and the quality of deposited layers are improved.

A. Preferred Reactor Module

While the preferred embodiments can be applied to other reactors known to those of skill in the art, use of a floating substrate reactor is particularly advantageous. In a floating substrate reactor, a substrate can be processed without being mechanically supported; that is, the substrate can be processed without being directly contacted by a solid support. This enables very uniform and rapid heating of the substrate without the cold spots that can occur in reactors where substrates are mechanically contacted during a semiconductor fabrication process. In addition, parts of the reactor surrounding the substrate are preferably relatively massive such that each has a high heat capacity relative to the substrate, helping to stabilize the temperature of the substrate and minimizing the susceptibility of the reactor to temperature fluctuations upon loading and unloading of the substrate into the reactor. The basic configuration of such a floating substrate reactor is available commercially under the trade name Levitor® from ASM International N.V. of Bilthoven, The Netherlands. In this reactor, a substrate, such as a wafer, is typically accommodated between relatively massive upper and lower blocks. More detailed information about the Levitor® can be found in U.S. Pat. No. 6,183,565, the disclosure of which is incorporated herein by reference.

In addition, a Low Temperature (LT) module of the Levitor®, also available from ASM International N.V. of Bilthoven, The Netherlands, allows for processing at low temperatures and permits the annealing of copper (Cu) films at temperatures in the range of about 200-400° C. A short description of the Levitor® Low Temperature module is provided below. More detailed information about the Levitor® Low Temperature copper anneal module can be found in WO 01/50502 and US Patent Application Publication No. 2002/0092584, the disclosures of which are incorporated herein by reference.

In some preferred embodiments, both upper and lower reactor blocks of the reactor are provided with heaters, and the temperature of the blocks can be controlled such that the blocks have different temperatures: one block at a higher temperature and the other block at a lower temperature, wherein the desired substrate temperature lies between the high temperature and the low temperature. In other preferred embodiments, both blocks are heated to substantially the same temperature, which is preferably equal to the desired substrate temperature. The substrate temperature can also be regulated by varying the heat transference between the substrate and the reactor blocks. Methods for controlling the substrate temperature by varying heat transference are described in greater detail in co-pending U.S. application Ser. No. 10/186,269, METHOD AND APPARATUS FOR THE TREATMENT OF SUBSTRATES, filed Jun. 27, 2002 and METHOD FOR THE HEAT TREATMENT OF SUBSTRATES, filed Oct. 31, 2003,the disclosure of which is incorporated herein by reference.

Also, in some embodiments, to allow a substrate to be processed at a temperature within a processing window for optimal deposition while the upper and lower blocks are maintained at temperatures outside that window and to be able to quickly cool the substrate, the upper and lower blocks can be set at different temperatures, as noted above. For example, the upper block of the Levitor® Low Temperature module can be kept hot, preferably about 50° C. or more above the desired substrate treatment temperature, while the lower block is kept cold, preferably about 50° C. or more below the desired substrate treatment temperature or, more preferably, at 40° C. or less. The upper block is preferably heated by an array of heating elements, and the lower block is preferably water-cooled. The blocks are provided with a plurality (preferably about 60 to 100) of gas injection channels, spaced from each other and distributed over the surface of the block facing the semiconductor substrate. When the blocks are in a closed position with a substrate loaded between them, the gap between the substrate and each of the blocks is preferably less than about 2.0 mm, more preferably less than about 1.0 mm, and most preferably less than about 0.5 mm. In the illustrated embodiments the gap is about 0.2 mm. Typical powers required to maintain a temperature difference, $\Delta T$, of about 400° C. between the blocks are in a range of roughly about 5-8 kW for 300 mm semiconductor wafers.

The temperature of a substrate within the reactor can be varied by switching the type of gas above and below the substrate between a high thermal conductivity gas and a low thermal conductivity gas (e.g., He or $N_2$, respectively), and/or by varying the position of the substrate relative to the two blocks (e.g., the relative distance of the substrate from each block). When the blocks are at different temperatures, switching the composition of the gases on one or both sides can change the thermal conductivity of the medium between the substrate and the blocks. Thus, switching the gas compositions on one or both sides of the substrate can be employed to change the substrate temperature within a range between the temperatures of the two blocks. In addition, switching the relative flow rates of gases on either side of the substrate can move the substrate closer to one or the other of the blocks, thereby also changing the substrate temperature.

When the blocks are in a closed position and arranged close to a substrate, large gas flows (preferably greater than about 5 slm and, in a some embodiments, about 10 slm on each side) ensure that the substrate surfaces are effectively protected from the outside ambient. For example, this allows a Cu film to be annealed in the Levitor® Low Temperature module without the need to apply an additional gate valve to prevent oxidation of the Cu film. Because of the large gas flows, the substrate only comes into contact with outside air when the blocks are open and the substrate is relatively non-reactive (i.e., when the substrate is cold in comparison to its temperature during treatment). Preferably, to ensure that the substrate is relatively cold, the substrate temperature is switched to a low value at the end of processing, e.g., by appropriately switching the gases flowing above and below it, before opening the blocks.

In arrangements where the blocks are maintained at different temperatures, however, the substrate is susceptible to temperature non-uniformities. This is caused by the fact that temperature differences on different sides of a substrate produce a temperature gradient through the thickness of the substrate and thus can cause bowing of the substrate, which can immediately result in a temperature non-uniformity. For example, when the same gas is used on both sides of the substrate, with a $\Delta T$ between the blocks of about 400° C., and a gap of about 0.2 mm between each block and the substrate, a temperature non-uniformity across the substrate of about 1° C. per 1 μm bow can result. Thus, for a typical rest bow of about 10 μm, the difference in temperature of different parts of the substrate can be up to about 10° C. Advantageously, however, this non-uniformity can be reduced when the $\Delta T$ between the blocks is made smaller or when different gases are used on both sides of the substrate in order to reduce the differences in temperature between the two sides of the substrate.

Heat-up and cool-down with such an arrangement can advantageously be fast. Using good heat conduction in the thin gas layers results in typical heat-up and cool-down times of preferably less than about 5 seconds and, more preferably, between about 2-3 seconds.

As noted above, the blocks are preferably relatively massive compared to the substrate. The blocks thus have sufficient heat capacity such that, when heated, heat is transferred to an unheated substrate loaded between the side sections with negligible temperature loss from the blocks. The blocks preferably are formed of metal and have a preferred vertical thickness of greater than about 10 mm, more preferably greater than about 40 mm.

It will be appreciated that it is not trivial to deposit films from more than one reactant in reactors such as the Levitor® reactor, as suggested in U.S. Pat. No. 6,183,565, the disclosure of which is incorporated herein by reference. For example, with conventional CVD processes, it has been found that when deposition gases are pre-mixed, there is a tendency to cause deposition in the gas channels and in the tubing. In addition, there is a tendency toward depletion of reactants in the small volume in between the substrate and the block surface. This depletion can lead to relatively heavy deposition on the substrate immediately below the gas inlet channels, and to less deposition on areas of the substrate in between such inlet points. Consequently, processing using multiple reactants in these reactors can be problematic both in terms of adversely affecting reactor surfaces and in terms of their deposited layers on substrates, which exhibit poor uniformity of both thickness and coverage.

B. ALD in the Preferred Reactor Module

It has been found that the problems that can exist when depositing films using multiple reactants in reactors such as the Levitor® reactor can be avoided when ALD processes are used to deposit the films.

These problems can advantageously be avoided for a number of reasons. For example, in accordance with some preferred embodiments, when independent gas inlet channels are used for different reactants, there typically will be no deposition in the gas inlet channels.

Also, when a block facing the substrate device side is kept at a relatively low temperature (but high enough to avoid condensation), there will be substantially reduced ALD growth on the surfaces of that (typically colder) block facing the substrate. Alternatively, when the block facing the substrate device side is kept at a relatively high temperature (but not so high that thermal decomposition of a reactant occurs), such that the reaction conditions are outside the optimal process window for ALD, substantially reduced ALD deposition will occur on surfaces of this block due to a tendency for reactants to desorb.

Moreover, even where reactant depletion occurs, self-saturating pulses and true self-limiting reactions do not generally cause non-uniformity in ALD films. This is due to the saturation of absorption sites for reactants, which typically prevents an excess build-up of reactants. Thus, the problems with deposition on reactor surfaces and with poor quality deposited layers can be avoided.

In addition, various other features of the preferred reactor make it particularly advantageous for ALD processes. For example, the reactor volume is particularly small, due to the small spacing of the substrate from each of the upper and lower reactor blocks of about 2 mm or less, preferably about 1 mm or less and, more preferably, of about 0.2 mm or less. The small reactor volume allows a rapid switching between the alternating reactant pulses in ALD; any traces of a reactant pulse still residing in the reactor after termination of the pulse can be purged from the reactor in a very short time.

Not only is the reaction space volume small, but the gas distribution system used with the preferred reactor, described in further detail below, also has a small volume. Unlike conventional showerheads, the gas distribution system does not comprise a relatively voluminous gas distribution section to distribute gas laterally and uniformly over the substrate. Instead, the gas distribution system preferably comprises a set of horizontal channels to distribute the gas in a lateral direction over the substrate, which is typically placed in the reactor in a horizontal position. Preferably, a set of vertical channels, each vertical channel preferably in communication at one end with one of the horizontal channels and at the other end with the reaction space, discharges the gas into the reaction space. The channels are preferably drilled in the reactor blocks, which are preferably massive plates. The horizontal channels are relatively small in diameter, preferably about 3-5 mm and more preferably about 4 mm in diameter. The vertical channels are preferably about 1-3 mm in diameter and more preferably about 2 mm in diameter. Consequently, the total volume of the set of horizontal and vertical channels is small and easily purged in comparison to a conventional showerhead that comprises a relatively open gas distribution volume upstream of a perforated faceplate. In addition, the small gas volumes at both sides of the substrate further ensure that the total reactor volume is purged particularly efficiently.

Another advantage of the preferred reactor for ALD is the ability to control the temperature of the substrate at a value different from the temperature of the reactor blocks, thereby helping to minimize deposition on the reactor blocks. It will be appreciated that true self-limited atomic layer deposition will only occur in a certain temperature window. Preferably, the reactor block from which the reactants are dispersed is maintained at a temperature outside the window for optimized ALD growth, and preferably at a temperature where little or no growth occurs, so that little or no deposition-occurs on this block, while the substrate is maintained at a temperature within the window for ALD growth.

An additional advantage of the preferred reactor, e.g., the Levitor® LT module is that, during processing, the temperature of the substrate can rapidly be switched. This can beneficially be exploited in a manner as disclosed by Kurabayashi et. al. in a paper. entitled "Temperature synchronized molecular layer epitaxy," Applied Surface Science 82/83 (1994) 97-102, the disclosure of which is incorporated herein by reference. Kurabayashi describes, among other examples, a process wherein a GaAs film is deposited on a substrate by exposing the substrate sequentially and repeatedly to pulses of $AsH_3$ and TMG (Tri Methyl Gallium), and wherein the substrate temperature is 500° C. during the $AsH_3$ pulse and 450° C. during the TMG pulse. The higher temperature during the $AsH_3$ pulse is preferred for achieving a sufficient reaction rate, whereas the lower temperature during the TMG pulse is preferred for avoiding premature thermal decomposition of the TMG. In general, this technique allows the use of temperature sensitive precursors during the low temperature part of the cycle whereas the high temperature part of the cycle ensures that a sufficient reaction rate and/or film quality is achieved. This is beneficial in the deposition of metals, metal oxides, and metal nitrides.

In some situations, cycling the temperature is a good alternative to the use of a plasma during the deposition process. Further, when depositing multicomponent materials, temperature cycling allows the use of combinations of reactants, in particular metal compounds, whose respective process windows do not match.

Advantageously, the preferred reactor is well suited for rapid switching of substrate temperature without requiring a large peak power and large variations in power for the heating system. It will be recognized that the temperatures between which processing is switched can be tailored depending on the reactants used. Also, the timing of the temperature switching can be tailored with respect to the timing of the gas pulses, to achieve optimum results. After supplying a first reactant at a first substrate temperature, the temperature of the substrate can be switched to the second temperature at the beginning, during or after the supply of the second reactant pulse. Although the moment of temperature switching can be shifted in time with respect to the moment of reactant switching, it will be appreciated that the period in which the reactor is at the first temperature should overlap with presence of the first reactant and the period in which the reactor is at the second temperature should coincide with the presence of the second reactant. Preferably, the duration of the period between which the temperature and reactants are switched is the same and switching of the temperature and reactants occurs at substantially the same frequency.

C. Detailed Description To The Figures.

Reference will now be made to the Figures, wherein like numerals refer to like parts throughout.

With reference to FIG. 1, the temperature window for optimal ALD is explained in further detail. In this figure, the growth of the film per cycle is given as a function of temperature. The horizontal axis indicates the deposition temperature and the vertical axis indicates the amount of film growth per deposition cycle. W denotes the temperature window in which optimized atomic layer deposition occurs. In an ideal case for the temperature window W, represented in the drawings as a horizontal line across the vertical growth axis, one monolayer of film is deposited per full cycle. It will be appreciated, however, that due to surface reconstruction or steric hindrance by large surface ligands, less than a monolayer per cycle is typically deposited in an actual ALD process performed within this window, but optimal self-limited growth still obtains.

Outside the window, various factors can cause greater than or less than optimized growth per cycle. For example, at the low temperatures at the low end of the temperature window (W), depending on whether a reactant condenses at those temperatures, more or less than a monolayer can be deposited. $L_1$ denotes a region of increased growth per cycle, exhibited by reactants that condense at those temperatures. $L_2$ denotes a region of decreased growth per cycle, for other reactant combinations. The temperature dependence described by $L_2$ is indicative of a process with combinations of reactants for which the reaction is activation energy limited, where the reactivity of the reactants becomes too low. It should be noted, however, that even for chemistries exhibiting a low-temperature curve like $L_2$, increased deposition can eventually occur at lower temperatures than those shown, since condensation usually will take place at a low enough temperature.

On the other hand, at temperatures at the high end of the temperature window, other factors can lead to deposition of greater than or less than one monolayer per cycle. $H_1$ indicates a situation where the growth per cycle is above the optimized, self-limited growth. This can occur for some process recipes when the temperature is so high that thermal decomposition of one of the reactants occurs or where non-volatile reaction by-products are formed. $H_2$ represents a situation where the growth per cycle is less than one monolayer. This may be the result of desorption or dissociation of a surface ligand that is needed to activate the surface for the next reactant. It should be noted, however, that even for chemistries exhibiting a high-temperature curve like $H_2$, increased deposition can eventually occur at even higher temperatures than those shown, when thermal decomposition causes deposition of more than one monolayer per cycle.

As shown in FIG. 1, maintaining the substrate surface temperature within a certain window is important for achieving the desired amount of growth of a thin film on a substrate by ALD. Preferably, information about the growth curve for a particular reaction is used to select an appropriate substrate temperature. Thus, a substrate temperature is preferably chosen that falls within the window in which ALD occurs. Advantageously, the preferred embodiments also take advantage of the other information available from the growth curves to minimize deposition on the reactor walls and to provide an improved ALD method and apparatus.

Figure 2:
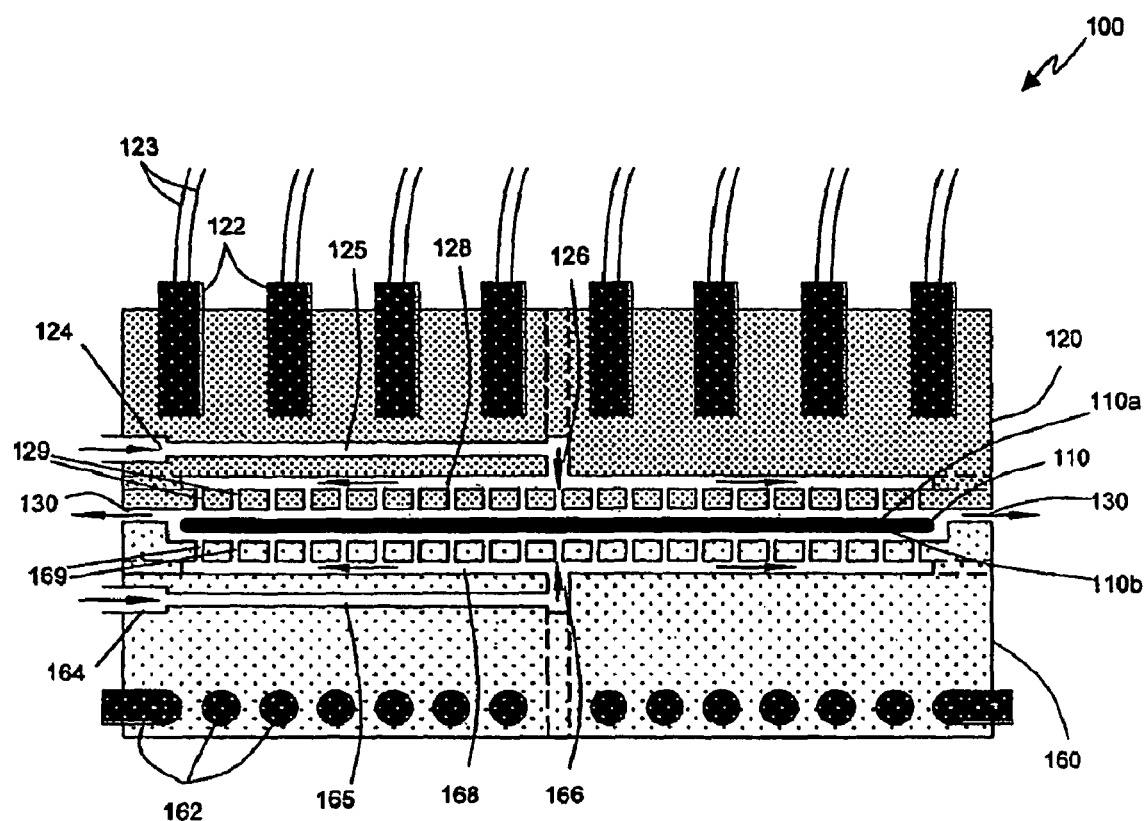
FIG. 2 shows, schematically, a cross-sectional side view of a reactor having a top and a bottom part between which a substrate is accommodated, wherein one reactor part is heated and the other reactor part is cooled, in accordance with certain preferred embodiments of the invention.

Exemplary embodiments will now be described with reference to FIGS. 2-9. FIG. 2 shows schematically a reactor 100 having the general features of a Levitor® Low Temperature module. The reactor 100 comprises an upper reactor block 120 and a lower reactor block 160, between which a substrate or wafer 110 is accommodated. It will be appreciated that the surfaces of the blocks 120 and 160 facing each other delimit a reaction chamber for processing the wafer 110. The upper reactor block 120 is preferably heated through resistance heating, using an array of heating elements 122, each heating element connected with wires 123 to a source of electrical energy. Gas flows through the upper block 120 via a gas inlet opening 124, and gas inlet channels 125 and 126. Then the gas is dispersed over an entire upper or first major surface 110a of the wafer 110 via a plurality of gas dispersion channels 128, in communication with the gas inlet channel 126. Finally, the gas is discharged from the upper block 120 towards a first surface 110a through gas injection channels 129.

Shown on the other side of the wafer 110, the lower reactor block 160 is provided with cooling channels 162 for the passage of a cooling fluid. Gas flows through the lower block 160 via a gas inlet opening 164 and gas inlet channels 165 and 166. Then the gas is preferably dispersed over an entire wafer lower or second surface 110b via a plurality of gas dispersion channels 168 in communication with the gas inlet channel 166. Finally, the gas is discharged from the lower block 160 towards the second major surface 110b of wafer 110, opposite the first surface 110a, through gas injection channels 169. In the reaction space between the blocks 120 and 160, the gases are preferably flowed in a radial direction and are exhausted from the reaction space via a peripheral gap 130 between the blocks 120 and 160.

It will be appreciated that the gas dispersion channels 128, 168 can also be provided in individual sections which do not extend over the whole of the surfaces 110a and 110b, respectively. For example, while one horizontal gas inlet channel 125, 165 and one vertical gas inlet channel 126, 166 are illustrated distributing gas over the entire surface 110a or 110b, respectively, more than one gas inlet channel 125, 165 and 126, 166 can be provided, each providing gas to a gas dispersion channel that only extends over a limited section of the surface 110a or 110b.

Figure 3:
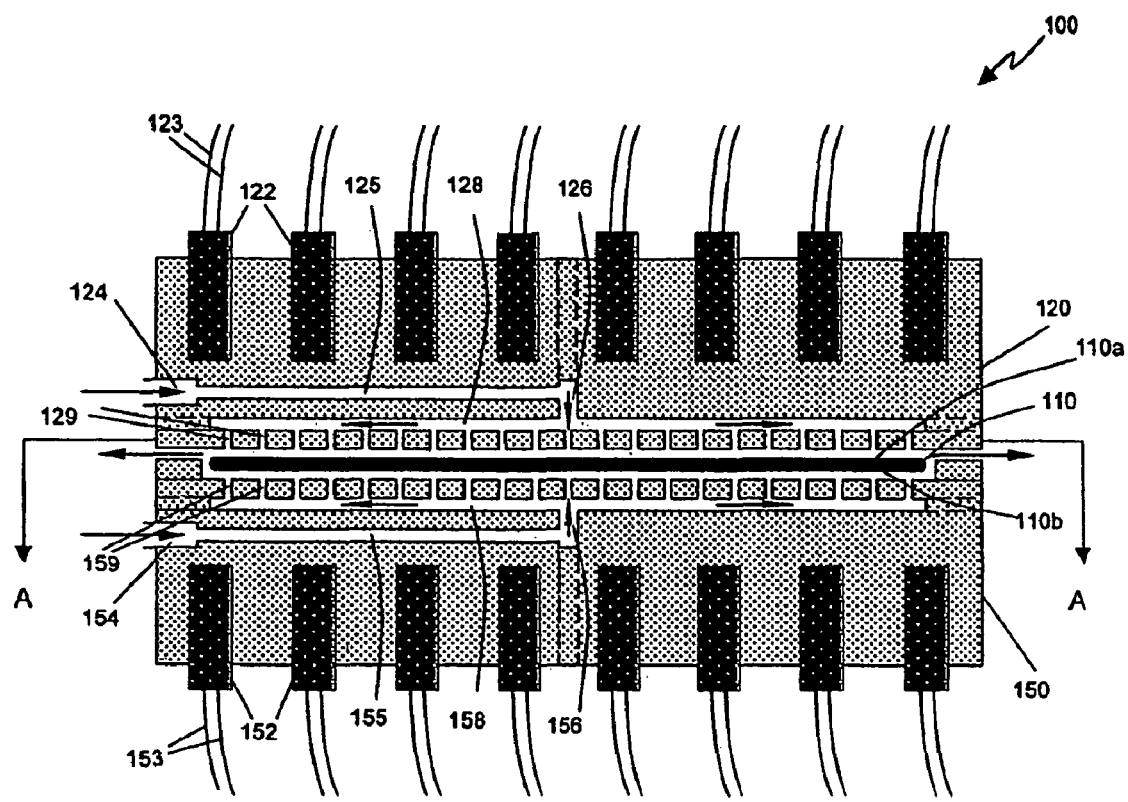
FIG. 3 shows, schematically, a cross-sectional side view of the reactor of FIG. 2, wherein both reactor parts are heated, in accordance with other preferred embodiments of the invention.

It will also be appreciated that a lower block need not be actively cooled. For example, in another embodiment, as shown in FIG. 3, the lower block 150 is provided with the heating elements 152, instead of cooling fluid channels, to maintain the lower block 150 at a raised temperature. The temperature of the lower block 150 can be the same as the temperature of the upper block 120 or it can be a different temperature. Preferably, the heating elements 152 are resistive heaters and are each connected via wires 153 to a source of electrical energy. Gas is flowed through the lower block 150 via a gas inlet opening 154 and gas inlet channels 155 and 156. Then the gas is dispersed over the entire wafer surface 110b via a plurality of gas dispersion channels 158 in communication with the vertical gas inlet channel 156. Finally, the gas is discharged from the lower block 150 towards the second surface 110b of the wafer 110, opposite the first surface 110a, through gas injection channels 159.

Figure 4:
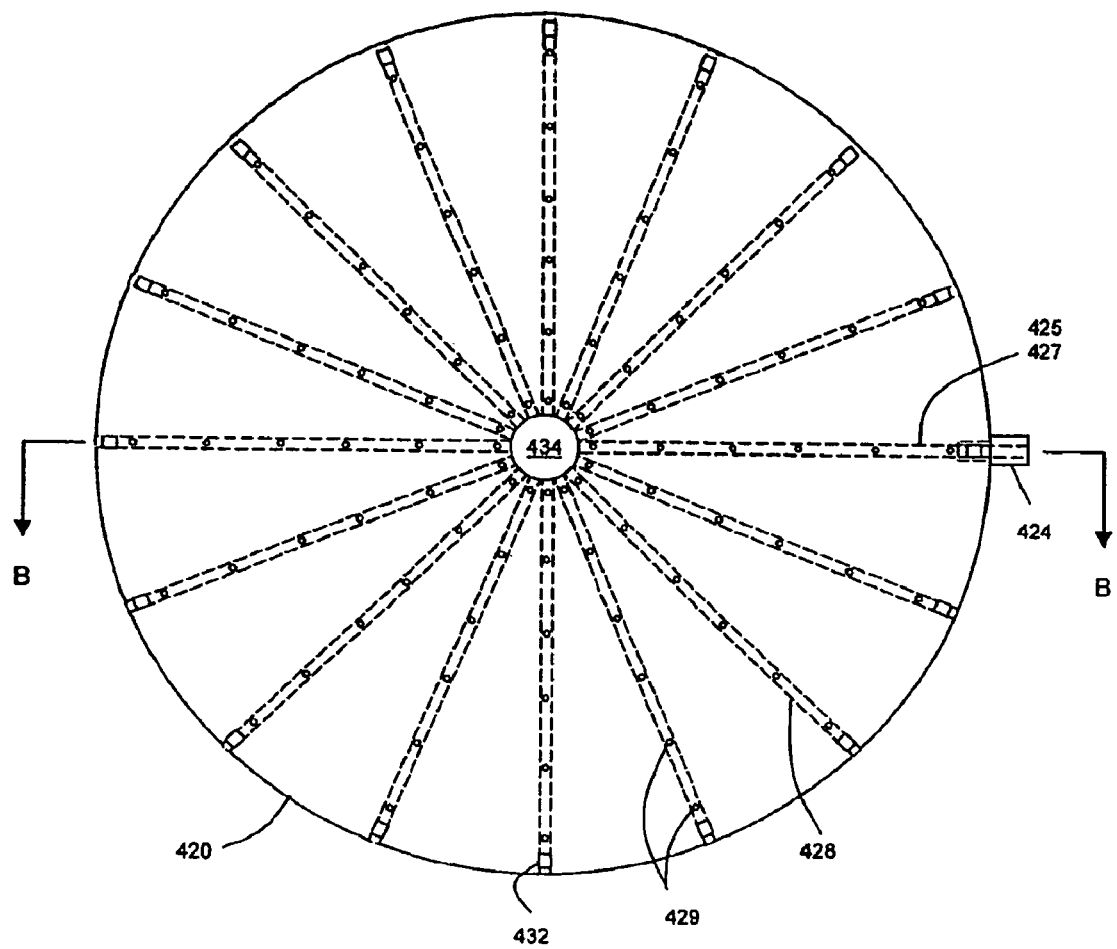
FIG. 4 shows, schematically, a cross-sectional plan view of one of the two reactor parts of FIG. 3 as viewed along line A-A and showing gas channels, in accordance with preferred embodiments of the invention.
Figure 5:
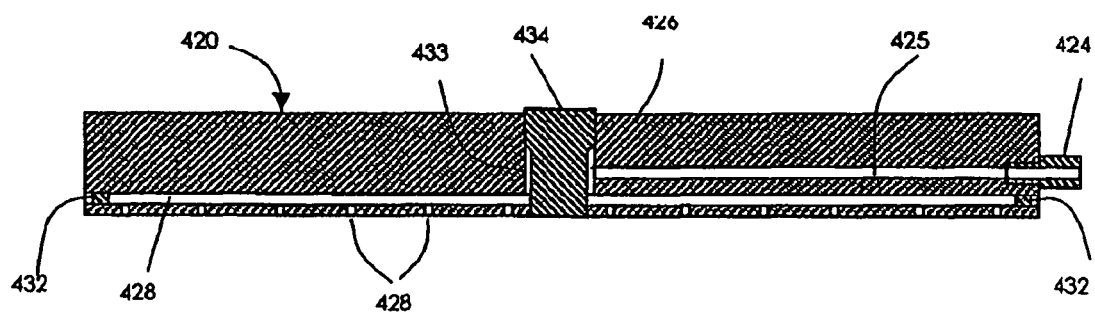
FIG. 5 shows, schematically, a cross-sectional side view of the reactor part of FIG. 4 as viewed along line B-B.

The configuration of the gas channels in the blocks is shown in greater detail in FIGS. 4 and 5. FIG. 4 shows a horizontal cross-section of a block 420 similar to the block 120 of FIG. 3, taken across plane A-A of FIG. 3. Like elements are referenced by reference numerals having like last two digits relative to the elements of FIG. 3. The block 420 is provided with the gas dispersion channels 428 in a radial configuration. Each gas dispersion channel 428 is provided with a plurality of gas injection channels 429.

FIG. 5 shows a vertical cross-section taken along plane B-B in FIG. 4. Gas enters the block 420 through the inlet 424, which is in communication with the gas inlet channel 425, through which gas is discharged into the annular vertical inlet channel 426. The gas dispersion channels 428 are in communication with the vertical channel 426. The annular channel is formed by inserting a plug 434 into a cylindrical hole 433 in the block 420. As the plug 434 has, over a part of its length, a smaller diameter than the cylindrical hole 433, the vertical inlet channel 426 is left open. The gas dispersion channels 428 are preferably drilled in the block 420 and their radially outward ends are preferably closed by inserting plugs 432.

Preferably, the cross-sectional area of each of the gas dispersion channels 428, as represented by, e.g., their diameter(s), is larger than the cross-sectional area of each of the gas injection channels 429 (FIG. 4), so that a roughly homogeneous distribution of gas through the gas dispersion channels 428 and vertical gas injection channels 429 is achieved. In a preferred embodiment, the diameter of the gas dispersion channels 428 is about 3-5 mm and more preferably about 4 mm and the diameter of the gas injection channels 429 are about 1-3 mm and more preferably about 2 mm.

In addition, the gas injection channels 429 themselves preferably comprise a first section with a relatively small first diameter, directly connected to the gas dispersion channels 428, and a second section with a wider second diameter, which opens to the reaction space occupied by the substrate 110 (FIGS. 2 and 3). Preferably, the first diameter is about 1 mm or less and the second diameter is about 1 mm or more. In one preferred embodiment, the first diameter is about 0.25 mm and the second diameter is about 2 mm, the length of the first section is about 1 mm and the first section is at an upstream end intersecting with a gas dispersion channel 428 whereas the length of the second section is about 3 mm. The downstream end of the first section is in communication with the upstream end of the second section. The downstream end of the second section opens into the reaction space. In this way, a narrow restriction in gas injection channel 429 is provided, whereas the second wider section allows expansion of the gas jet and reduction of the gas velocity before discharging the gas into the reaction space, so that the occurrence of gas jet marks on the substrate is advantageously avoided.

It will be appreciated that various other arrangements are possible for the gas channels, so long as they allow for gas to be distributed over a substrate surface. For example, the gas dispersion channels 428 need not be in a radial configuration but, e.g., can be arranged according to a pattern of parallel, equidistant lines, connected at one end with a gas inlet channel oriented perpendicular to the gas dispersion channels, forming a rake type configuration. Further, the two sets of separated gas dispersion channels need not necessarily be vertically displaced but they can be, e.g., two oppositely oriented, interlaced rakes, disposed at about the same vertical level. Similarly, it will also be appreciated that various other arrangements are possible for the gas inlet 424 and the gas inlet channels 425 and 426, so long as they allow gas to be provided to the gas dispersion channels 428.

Figure 6:
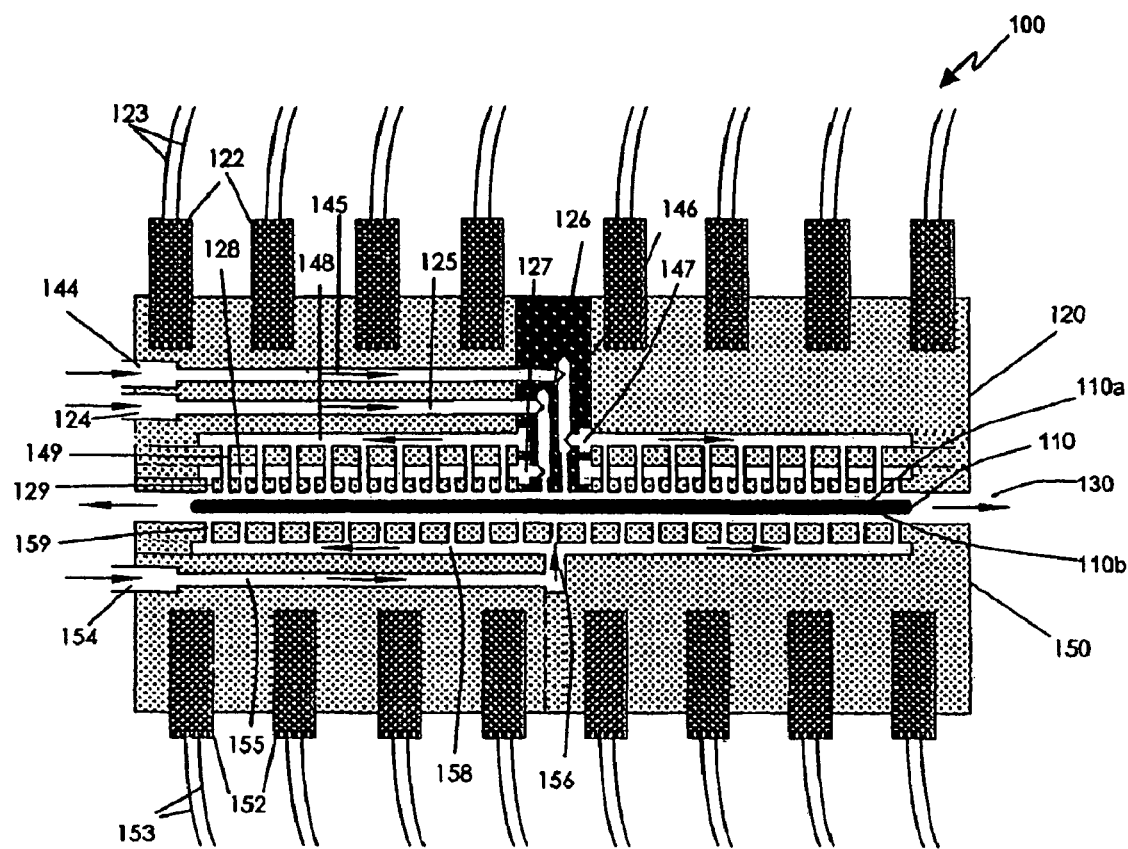
FIG. 6 shows, schematically, a cross-sectional side view of a reactor in which the top reactor part comprises two separated sets of gas supply channels, in accordance with another preferred embodiment of the invention.

With reference to FIG. 6, a particularly advantageous embodiment is shown, wherein the upper block 120 is provided with two different, separated sets of gas distribution channels, one set of channels for each one of the two mutually reactive reactants typically used during the deposition process. The first set comprises a gas inlet opening 124, in communication with one end of a gas inlet channel 125, the other end of the gas inlet channel 125 in communication with a vertical inlet channel 126, discharging into an annular gas distribution channel 127. A plurality of gas dispersion channels 128 is in communication with the annular gas distribution channel 127. Finally, gas is discharged from the gas dispersing channels 128 through gas injection channels 129 towards the first surface 110a of the wafer 110.

A second set of gas distribution channels, separated from the first set, is configured similarly to the first set. The second set comprises a second gas inlet opening 144, in communication with one end of a second gas inlet channel 145, the other end of the second gas inlet channel 145 being in communication with a second vertical inlet channel 146, discharging into a second annular gas distribution channel 147. A plurality of second gas dispersion channels 148 are in communication with the annular gas distribution channel 147. Finally, gas is discharged from the gas dispersing channels 148 through the second gas injection channels 149 towards the first surface 110a of wafer 110. Preferably, other features in FIG. 6 are similar as those in FIG. 3.

It will be appreciated that FIG. 6 is a schematic, cross-sectional side view, showing both sets of channels in the upper block 120 simultaneously. Preferably, the two sets of horizontally extending gas dispersion channels 128 and 148, shown with the first set at a first vertical level and the second set at a second vertical level, are not just vertically displaced with respect to each other, but are also horizontally displaced. In this way the vertical gas injection channels 149 communicating with the upper set of gas dispersion channels 148 do not intersect the lower set of gas dispersion channels 128.

Figure 7:
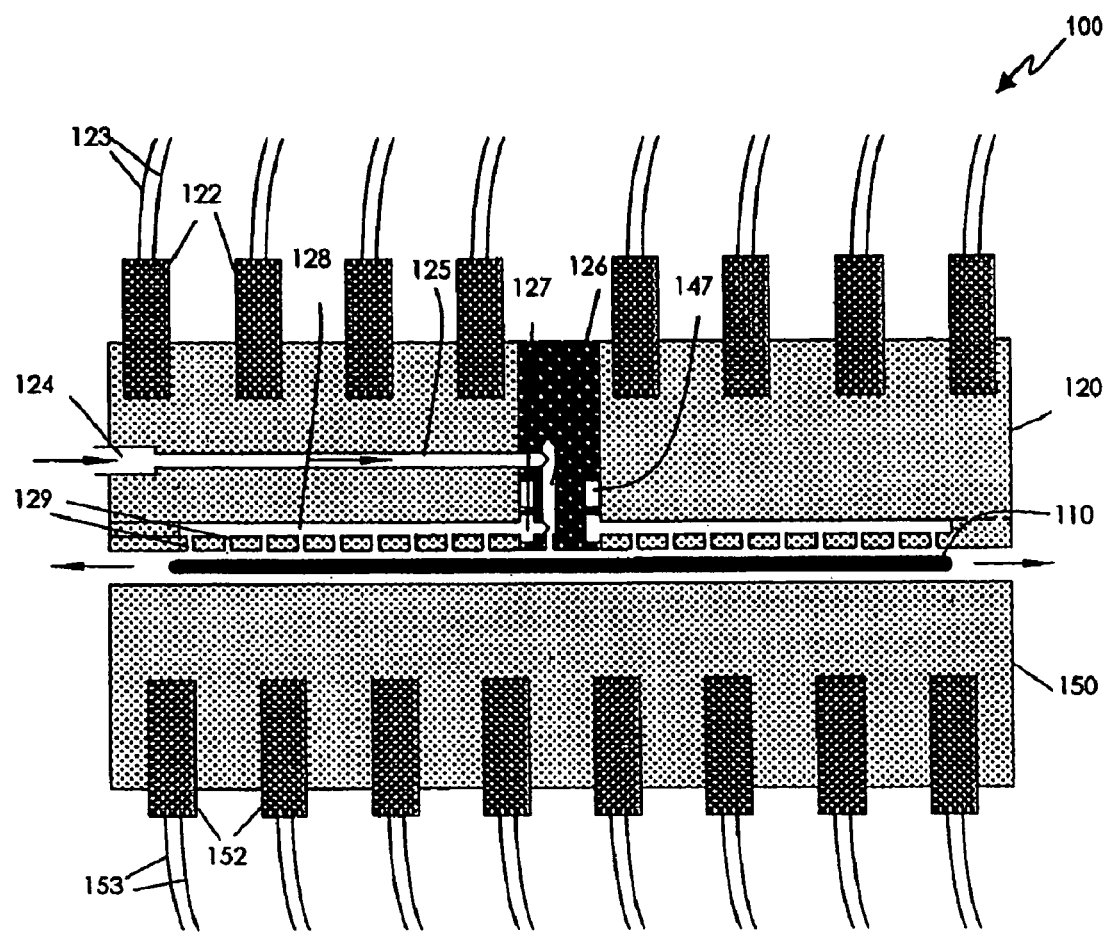
FIG. 7 shows, schematically, a cross-sectional side view of the reactor parts of FIG. 6, showing a first set of the gas channels in the top reactor part.
Figure 8:
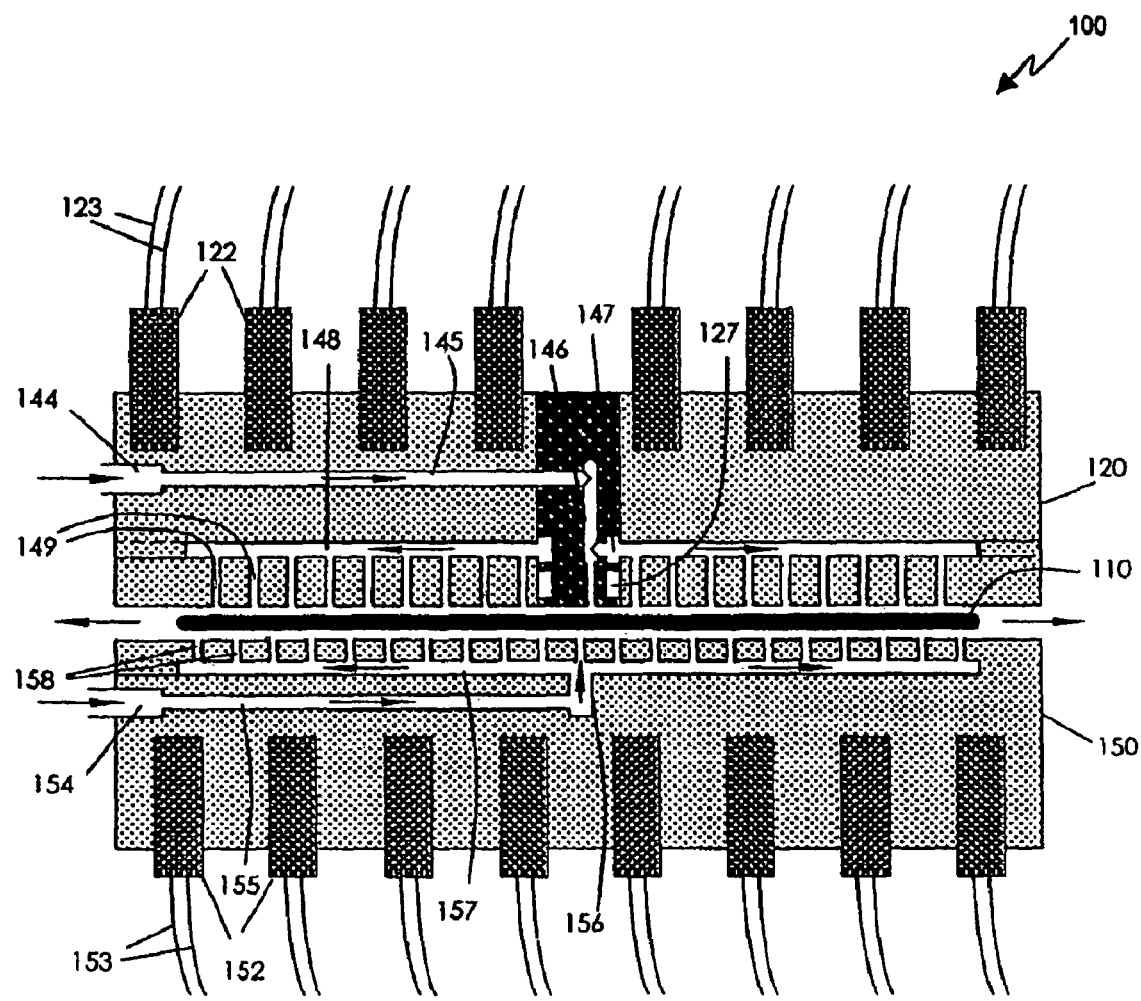
FIG. 8 shows, schematically, a cross-sectional side view of the reactor parts of FIG. 6, showing a second set of the gas channels in the top reactor part.

An exemplary such arrangement is illustrated in greater detail in FIGS. 7 and 8. In FIG. 7, which is a cross-sectional view taken through a first plane, the first set of gas channels 124-129 is shown. Also shown is the annular gas distribution channel 147, which is an annular ring and visible at any cross-section taken through the center axis of the reactor blocks 120 and 150. In FIG. 8, which is a cross-sectional view taken through a second plane, slightly rotated with respect to the first plane, the second set of gas channels 144-149 is shown. Also shown is the annular gas distribution channel 127. It will be appreciated that while no channels are illustrated in the lower block 150 for clarity of illustration, the lower block 150 can be provided with channels, as discussed herein.

It will be appreciated that the number of sets of channels such as the gas channels 124-129 and 144-149 is not limited to two; rather, the number of separated sets of channels is only limited by the number of set of channels that can be accommodated in the block 120. For example, in other arrangements, three or more separated sets of channels can be accommodated in the block 120. Also, the lower block 150 can be provided with separated sets of channels, which can be arranged differently or can mirror those of the upper block 120.

Figure 9:
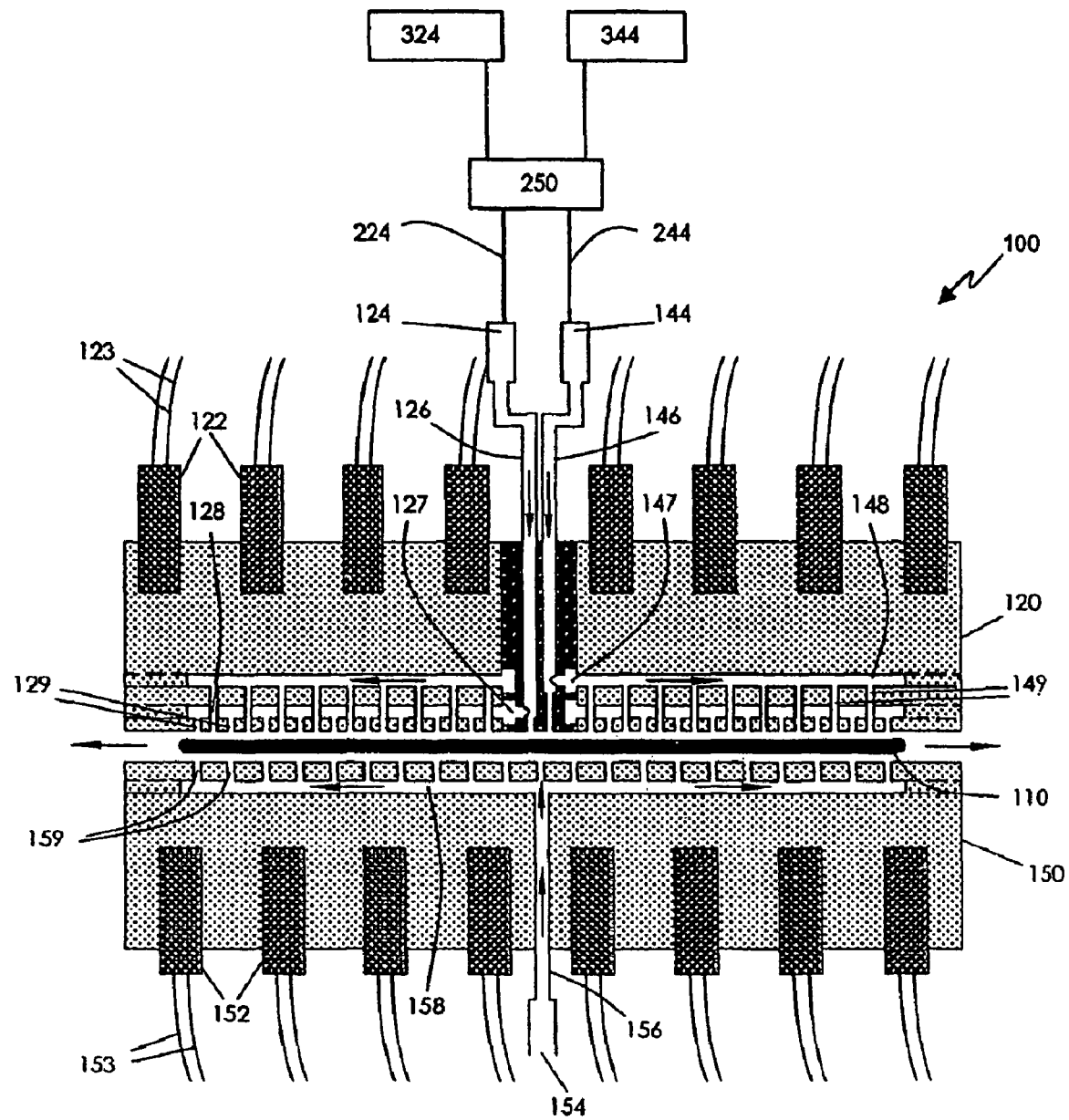
FIG. 9 shows, schematically, a cross-sectional side view of a reactor in accordance with yet another preferred embodiment of the invention.

A further embodiment is shown in FIG. 9. The gas inlets 124 and 144 of the upper block 120 are now provided at the top and through the center of the upper block 120 and the gas inlet 154 of the lower block 150 is provided at the bottom and through the center of the lower block 150. It will be appreciated that the gas inlets 124 and 144 can connected to gas lines 224 and 244, which are in turn connected to one or more controllers 250, which preferably comprise separate valves commonly controlled by a computer programmed to provide gases to the gas inlets 124 and 144 in sequential alternating, separated pulses. The controller 250 is preferably also connected to reactant sources 324 and 344. In addition, while illustrated only in FIG. 9 for ease of description, it will be appreciated that each of the gas inlets described above with reference to the other Figures can also be connected to gas sources and controllers for regulating the flow of gas from those gas sources. Also, the controller can be configured for inert gas valve control as described below.

Figure 10:
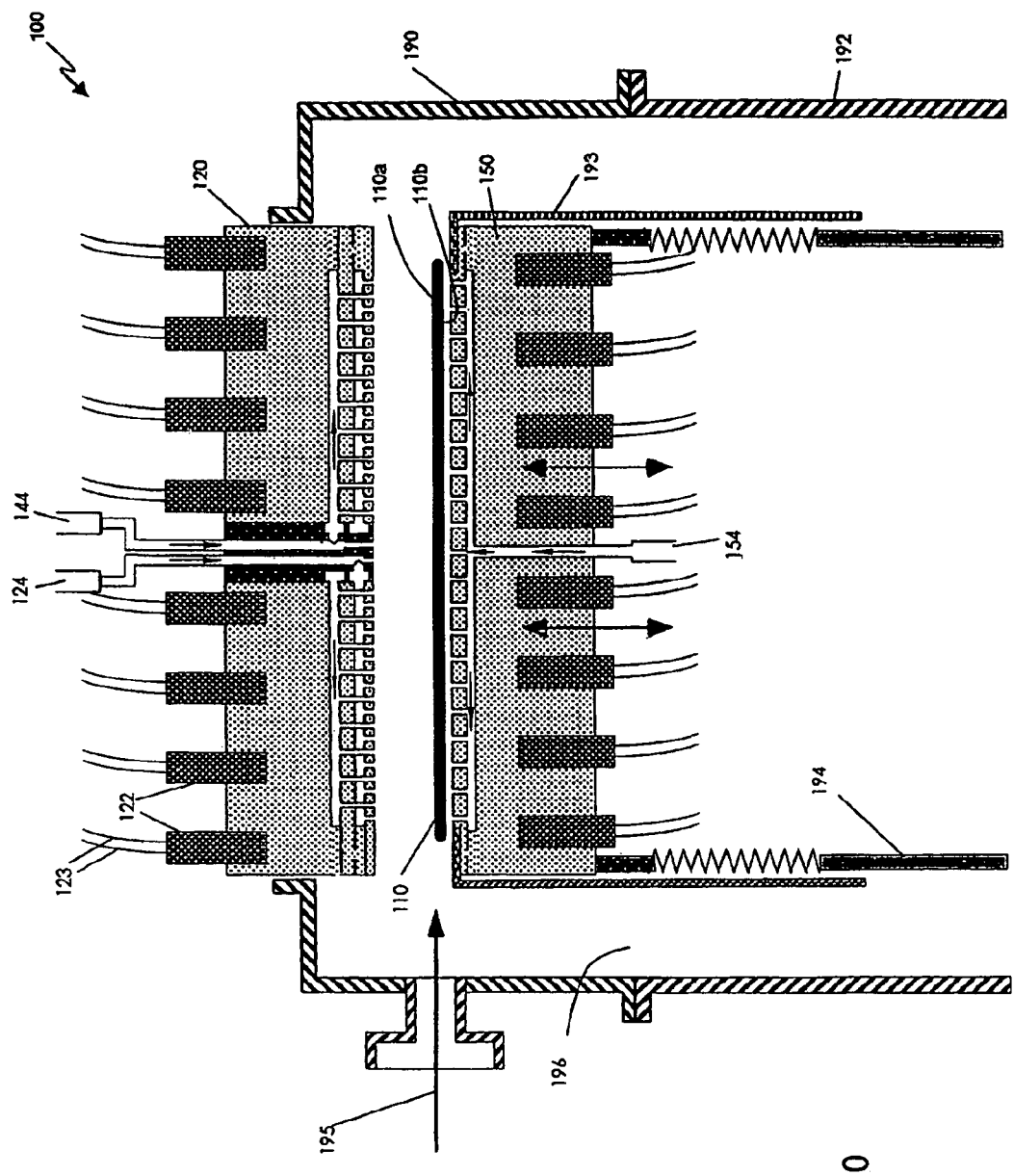
FIG. 10 shows, schematically, a cross-sectional side view of a more complete reactor module using the reactor of FIG. 9, in accordance with another preferred embodiment of the invention.

FIG. 10 is a schematic cross section of an ALD module based on Levitor® principles in accordance with another preferred embodiment. The configuration of the blocks 120 and 150 is similar to that shown in FIG. 9. A chamber around the blocks is delimited by an upper wall 190 and a lower wall 192. The upper block 120 is stationary and in fixed connection with the upper wall 190. The lower block 150 is vertically movable to allow for loading and unloading of the wafer 110 in between and out from between the blocks 120 and 150 through an opening 195. The mechanism for vertically moving the lower block 150 is schematically indicated by 194. A removable shield 193 is preferably connected to the lower block 150. Reaction gases are exhausted from the reaction space between the blocks via the annular channel 196.

In a preferred embodiment, the upper block 120 is maintained at a relatively low temperature, below the desired substrate temperature, and the lower block 150 is kept at a relatively high temperature, above the desired substrate temperature. Preferably, the removable heat shield 193 is kept at the same (relatively high) temperature as the lower block 150. As the shield 193 extends inwards such that its inside edge falls underneath the wafer 110 and reactant not adsorbed or reacted on the wafer 110 flows off the top surface 110a of the wafer and down to the shield 193, atomic layer deposition on the process system surfaces is concentrated on this shield 193, and not on other parts of the system. Advantageously, by removing and replacing the shield, e.g., once every 10-20 µm of film deposition, a low particle generation level can be obtained. In addition, by making the shield 193 longer, so that it extends further downwardly into the annular channel 196, it can also fulfill the role of largely depleting the outgoing gas stream of reactants, in that way cleaning up the gas that is exhausted.

It will be appreciated that the system for supplying gas to the reactor 100 can be configured in various ways known to those of skill in the art. Typically, the gas supply system will comprise one or more controllers which are programmed to provide separate, alternating gas pulses to the reactor 100. In some arrangements, each of the blocks of a Levitor® reactor can have separate gas inlets which can be connected to separate gas feeds, as described in U.S. Pat. No. 6,183,565, the disclosure of which is incorporated herein by reference, or as shown in the FIGS. 6 and 9 discussed herein. In such a case, it will be appreciated that a gas switching mechanism is preferably provided upstream to allow for an ALD sequence of alternating and repeating reactant pulses, separated by reactant removal (e.g., purging) steps. An exemplary switching arrangement is sometimes referred to as "inert gas valving," and is described in U.S. Patent Application Publication US 2001/0054377, the disclosure of which is incorporated herein by reference. In such an arrangement, pulses of reactant vapor are directed from the reactant source container towards the reaction chamber and, through switching of an inert gas flow, the reactant vapor flow is alternatingly: (i) directed to the reaction chamber by an inert gas flow from the source container towards the reaction chamber and then (ii) prevented from flowing from the source container to the reaction chamber by an inert gas flow in a reverse direction in a part of the conduit connecting the source container and the reaction chamber. The inert gas valving system is most particularly useful with liquid reactants that are vaporized prior to being employed in deposition. In other embodiments, the switching system can comprise conventional valves and valve control systems, particularly when more volatile gas sources are employed.

In the arrangements described above having separate gas inlets and separated sets of gas distribution channels in a block, each inlet can be connected to a different gas feed. For example, the separate channels can comprise a "spoke" arrangement, in which different spokes are connected to different reactant gas feeds.

In the preferred embodiments, deposition of a film can be performed by maintaining a ΔT of, e.g., about 100° C. or more and, more preferably, about 200° C. or more between the blocks. In the reactor 100 of FIG. 2, the lower block 160 is cooled and can be at a temperature below about 40° C. The upper block 120 can be heated to a temperature of about 350° C. By the appropriate choice of the types of gases and gas flow ranges below and above the wafer 110, a wafer temperature between that of the upper and lower blocks 120, 160, e.g., of about 300° C., can be achieved. This way of operation is beneficial for processes for which the increased temperature of about 350° C. results in desorption of the reactants from the high temperature surface but still does not result in substantial thermal decomposition of the reactants. In other words, with the block at about 350° C., the process should be in the $H_2$ regime discussed with reference to FIG. 1. In such an arrangement, it will be appreciated that the temperatures of the reactor blocks are preferably chosen based on the physical properties of the reactants, e.g., the decomposition and/or condensation points of the reactants.

In other embodiments, the lower upper block 150 can be heated, rather than cooled, but still maintained at a temperature that is lower than the desired wafer temperature, while the upper block 120 (FIGS. 3 and 6-10) is maintained at a temperature that is higher than the desired wafer temperature.

In yet another embodiment, the upper block 120 can be maintained at a lower temperature than the desired wafer temperature. When the desired wafer temperature is, e.g., about 300° C., one can keep the upper block 120 at about 230° C. and the lower block 150 at about 330° C. As noted above, this can be realized by the appropriate choice of the types of gases and flows below and above the wafer 110. For example, because the temperature of the lower block 150 is relatively close to the desired wafer temperature, one possibility is to physically keep the wafer 110 close to the lower block 150 to heat the wafer 110 to the desired wafer temperature, which is closer to the lower block temperature than it is to the upper block temperature. The temperature of the upper block 120 is preferably not be so low that condensation of the reactant occurs on it. In other words, for the block at about 230° C., the process is not in the $L_1$ regime, as discussed above regarding FIG. 1. Preferably, for the upper block 120 at about 230° C., the process is in the $L_2$ regime.

Processing according to the embodiments of the invention offers numerous advantages. For example, for embodiments employing separated channels for each reactant, by eliminating pre-mixing of the gases in the gas introduction manifold up to the point where the gases enter the deposition volume, deposition in the gas channels leading to the reaction chamber is substantially prevented. In addition, a small nitrogen purge is preferably constantly flowed through the gas channels to ensure that the gas inlet system remains clean up to the final injection point facing the wafer.

By preferably keeping the temperature of the upper block outside the window for optimal ALD growth, but outside the range in which thermal decomposition can occur and outside the range in which condensation can occur, deposition on the upper block is also substantially prevented. To prevent thermal decomposition or condensation, the temperature of the upper block can be kept sufficiently below (e.g., about 70° C.) or above, respectively, that of the wafer. As noted above, in addition to the wafer process temperature, the selection of temperatures also depends on the reactants used. Similarly, the temperature of the lower block is preferably also outside of the window for optimal ALD growth. Note that all the embodiments described herein can simply be inverted so that the reactants flow through the lower block, or reactants can flow through both blocks for double-sided deposition.

The inert gas that preferably flows through the gap in between the wafer and the lower block substantially prevents deposition on the backside of the wafer, or on the lower block surface facing the wafer. Calculations indicate that the reactants present in the flow above the wafer typically will not penetrate the narrow space between the wafer and the lower block. This is because the flow rate below the wafer is relatively large (greater than about 5 slm) and the gap narrow (about 0.2 mm). As the Reynolds number is very small, this flow is expected to be substantially laminar.

As none of the reactants typically enter the volume between the wafer and the lower block, back feeding of reactants from this volume to the volume between the wafer and the upper block, into which reactants are introduced, can be substantially eliminated. Consequently, by preventing the different reactant gases from coming into contact with one another, CVD growth can be prevented.

The preferred embodiments advantageously allow reactants to be switched quickly. In principle, gas switching is much faster at low pressures than under atmospheric conditions. This has been a primary reason why conventional ALD reactors operate at reduced pressures. However, the extremely small reaction volume in a reactor according to the preferred embodiments, such as a Levitor® reactor, in combination with relatively large gas flows, ensures a high gas velocity, even at atmospheric pressure. For example, when a flow of, e.g., about 10 slm is distributed in the volume above the wafer, and the gap is about 0.2 mm, the gas velocity at the edge of a 300 mm wafer is about 0.9 m/s at room temperature. More generally, the gas velocity is preferably arranged to be about 0.1 m/s to 10 m/s. Under the preferred conditions, a typical distance of the wafer radius, i.e., about 0.15 m, is traversed in about 0.02 seconds to about 2 seconds, or about 0.17 seconds in this particular example. At temperatures above room temperature this time will even be shorter due to thermal expansion of the gases. Thus, the reactors can be quickly cleared of reactants for the next reactant pulse, regardless of whether separated gas channels are provided for the reactants.

In some embodiments, rotation (preferably about 20 rpm) of the wafer can be introduced by flowing gas through a number of additional gas channels. Arrangements for such rotation are known to those of skill in the art and was accomplished, for example, in the first version of the Levitor® 4000 reactor, produced by ASM International N.V. of Bilthoven, The Netherlands. Such rotation can improve uniformity by more evenly exposing the wafer to reactants. Also, the uniformity can be further improved by the fact that the wafer tends to be self-centering in such arrangements, positioning itself at the center of the reactor.

In addition, in reactors according to the preferred embodiments, the heat-up rate is fast, preferably on the order of a few seconds. In contrast, in conventional systems this can take several 10's of seconds. Thus, the fast heat-up rate minimizes the time needed for the wafer to reach the equilibrium temperature.

Also, particle generation is typically low. This is because the preferred large flow above the wafer prevents foreign material from penetrating the space above the wafer. Moreover, by preventing deposition on the blocks facing a wafer, build up of films on that surface is prevented, thus preventing formation of particles.

The cost of processing according to the preferred embodiments is advantageously low. The main reasons for this are that no vacuum is required, and, given the relatively low temperatures involved, easy to machine materials (e.g., aluminum) can be used for the reactor.

The footprint of the preferred reactors is also advantageously small. For example, the current Levitor® LT module has a width of about 45 cm and a depth of about 75 cm. In addition, two LT modules can be placed above one another, further minimizing the area occupied by the reactors.

In an advantageously simple embodiment of the invention, the apparatus described above is operated at atmospheric pressure, so that the use of vacuum pumps can be omitted. It is not necessary, however, to operate the apparatus at atmospheric pressure. A pressure of about 10 mbar to about 100 mbar would still be high enough to have a wafer supported by a gas cushion. In addition, an advantage of reducing the pressure is that it results in an expansion of the gas flows and a more efficient purging of the reaction space.

It will be appreciated that while discussed with reference to a Levitor® reactor for ease of description, the preferred embodiments are not limited to such a reactor. For example, the gas distribution system and the heating arrangement described above can readily be applied to other reactors to similar advantageous effect.

It will also be appreciated that although the invention has been described in terms of certain preferred embodiments, various other combinations, omissions, substitutions and modifications can be made to the embodiments described above without departing from the scope of the invention. All such modifications and changes are intended to fall within the scope of the invention. Accordingly, the present invention is not intended to be limited by the description of the preferred embodiments, but instead is to be defined by referenced to the appended claims.

I claim:

1. A method of depositing a layer on a semiconductor substrate, comprising:
providing a reaction chamber having a first side section and a second side section located opposite one another, the side sections each having facing planar surfaces, wherein at least one of the side sections is heated to a temperature higher than about 200° C.;
placing the substrate in the reaction chamber between the first and second side sections;
applying two gas streams, in opposing directions, from the first and second side sections to two opposing planar sides of the semiconductor substrate, wherein a spacing between each of the first and second side sections and the semiconductor substrate is about 2 mm or less, wherein facing planar surfaces of the side sections extend completely across the opposing planar sides of the semiconductor substrate, wherein at least one of the gas streams provides first and second reactants in a sequence of alternating, separated pulses for an atomic layer deposition (ALD) process; and
maintaining the reaction chamber pressure at about atmospheric pressure while applying the two gas streams.

2. The method of claim 1, further comprising switching a temperature of the substrate between a first substrate temperature during pulses of the first reactant and a second substrate temperature during pulses of the second reactant.

3. The method of claim 2, wherein the first and second side sections are at different temperatures.

4. The method of claim 3, wherein switching the temperature of the substrate comprises changing at least one of the gas streams, wherein switching the temperature of the substrate substantially coincides with alternating the pulses of the first and second reactants.

5. The method of claim 4, wherein changing at least one of the gas streams comprises switching the relative distance of the substrate to each of the first and the second side sections to switch between the first and the second substrate temperature.

6. The method of claim 4, wherein changing at least one of the gas streams comprises changing a composition of at least one of the gas streams to change a thermal conduction of the at least one of the gas streams.

7. The method of claim 1, wherein gases discharged from the first side section have different thermal conduction properties from gases discharged from the second side section.

8. The method of claim 1, further comprising changing the composition of one of the gas streams.

9. The method of claim 8, wherein changing the composition of one of the gas streams alters the temperature of the substrate.

10. The method of claim 1, wherein applying two gas streams causes rotation of the substrate.

11. The method of claim 1, wherein applying two gas streams suspends the substrate between the first and the second side sections without any mechanical support.

12. The method of claim 1, wherein the side sections are massive relative to the substrate, wherein the side sections have sufficient heat capacity so that, when heated, heat is transferred to an unheated substrate loaded between the side sections with a negligible decrease in temperature of the side sections.

13. A method for semiconductor processing, comprising:
providing a processing apparatus having a first and a second reactor block defining a reaction chamber;
positioning a substrate in the reaction chamber between the first and the second reactor blocks, wherein the substrate is less than about 2 mm from each of the first and the second reactor blocks after positioning;
discharging, from the first reactor block, first and second mutually reactive reactants in alternating, temporally separated pulses onto the substrate, the first mutually reactive reactant having a first optimal temperature range for atomic layer deposition and the second mutually reactive reactant having a second optimal temperature range for atomic layer deposition; and establishing one or more desired substrate temperatures on the substrate using the first and second reactor blocks, wherein the first reactor block is set at a first block temperature during pulses of the first mutually reactive reactant, wherein the substrate temperature is within the first optimal temperature range during the pulses of the first mutually reactive reactant and wherein one of the first and second block temperatures is above the first optimal temperature range and the other of the first and second block temperature is below the first optimal temperature range during the pulses of the first mutually reactive reactant.

14. The method of claim 13, wherein the first block temperature is above the first optimal temperature range.

15. The method of claim 14, wherein the second block temperature is below the first optimal temperature range.

16. The method of claim 13, wherein the first and the second temperatures differ by about 100° C. or more.

17. The method of claim 16, wherein the first and the second temperatures differ by about 200° C. or more.

18. The method of claim 13, wherein the first block is actively heated and the second block is actively cooled.

19. The method of claim 13, wherein the second optimal temperature range is different from the first optimal temperature range and the first and the second blocks are set at temperatures outside of the second optimal temperature range, the first block temperature above a condensation temperature of the second reactant and below a decomposition temperature of the second reactant during pulses of the second reactant.

20. The method of claim 19, wherein temperatures of the first and the second blocks are maintained substantially constant during pulses of the first reactant and pulses of the second reactant.

21. The method of claim 13, wherein at least one of the mutually reactive reactants self-limitingly adsorbs on the substrate.

22. The method of claim 13, wherein discharging mutually reactive reactants in alternating, temporally separated pulses comprises flowing each of the two mutually reactive reactants through separate sets of gas channels.

23. The method of claim 22, further comprising continuously flowing an inert gas through each separate set of gas channels.

24. The method of claim 23, wherein the inert gas is nitrogen gas.

25. The method of claim 13, wherein discharging mutually reactive reactants is performed with the reaction chamber at about atmospheric pressure.

26. The method of claim 13, wherein discharging mutually reactive reactants is performed with the reaction chamber at a pressure of about 10-100 mbar.

27. A method for semiconductor processing, comprising:
loading a substrate in a reaction chamber;
supporting the substrate on a gas cushion in the chamber;
maintaining a pressure inside the chamber at about atmospheric pressure; and
directing mutually reactive reactants in alternating, temporally separated pulses onto a major surface of the substrate while supporting the substrate on the gas cushion in the chamber maintained at about atmospheric pressure.

28. The method of claim 27, wherein the reaction chamber comprises two reactor blocks, wherein one reactor block is disposed on one side of the substrate and the other reactor block is disposed on an opposite side of the substrate, wherein each reactor block is positioning about 1 mm or less from the substrate after loading.

29. The method of claim 27, wherein directing mutually reactive reactants comprises maintaining and flowing the reactant in separate channels before discharging the reactants onto a major surface of the substrate.

30. The method of claim 13, wherein the first block temperature is above a condensation temperature of the first reactant and below a decomposition temperature of the first reactant during pulses of the first reactant.

31. The method of claim 13, wherein the first block temperature is above a condensation temperature of the first and second reactants and below a decomposition temperature of the first and second reactants during pulses of the first and second reactants.

32. A method for semiconductor processing, comprising:
providing a processing apparatus having a first and a second reactor block defining a reaction chamber;
positioning a substrate in the reaction chamber between the first and the second reactor blocks, wherein the substrate is less than about 2 mm from each of the first and the second reactor blocks after positioning;
discharging, from the first reactor block, first and second mutually reactive reactants in alternating, temporally separated pulses onto the substrate; and
heating the substrate using the first and second reactor blocks to establish a plurality of alternating substrate temperatures on the substrate, wherein the substrate is at a first substrate temperature during pulses of the first mutually reactive reactant and at a second substrate temperature during pulses of the second mutually reactive reactant, the first substrate temperature different from the second substrate temperature.

* * * * *

UNITED STATES PATENT AND TRADEMARK OFFICE
CERTIFICATE OF CORRECTION

PATENT NO. : 7,754,013 B2
APPLICATION NO. : 11/527080
DATED : July 13, 2010
INVENTOR(S) : Ernst H. A. Granneman It is certified that error appears in the above-identified patent and that said Letters Patent is hereby corrected as shown below:

Title Page;
On Page 2, Col. 2, line 44 (Item 56), under "Other Publications," please change "$Si_2CI_6$" to --$Si_2Cl_6$--.

In Col. 7, line 41, please change "deposition-occurs" to --deposition occurs--.

In Col. 7, line 48, please change "paper." to --paper--.

In Col. 8, line 27 (approx.), please change "To The" to --of the--.

In Col. 9, line 36, please change "128," to --128--.

In Col. 15, line 59, please change "description" to --descriptions--.

Signed and Sealed this
Twenty-fifth Day of January, 2011

David J. Kappos
*Director of the United States Patent and Trademark Office*